(12) United States Patent  
Schlesinger

(10) Patent No.: US 7,647,027 B2
(45) Date of Patent: Jan. 12, 2010

(54) TUNEABLE FILTER CONTROL METHOD AND BASE STATION

(75) Inventor: Heinz Schlesinger, Mundelsheim (DE)

(73) Assignee: Alcatel Lucent, Paris (FR)

( * ) Notice: Subject to any disclaimer, the term of this patent is extended or adjusted under 35 U.S.C. 154(b) by 474 days.

(21) Appl. No.: 11/749,437

(22) Filed: May 16, 2007

(65) Prior Publication Data

US 2008/0026707 A1 Jan. 31, 2008

(30) Foreign Application Priority Data

Jul. 25, 2006 (EP) .................................. 06291217

(51) Int. Cl.
*H01Q 11/12* (2006.01)
*H04B 1/00* (2006.01)

(52) U.S. Cl. ..................... 455/121; 455/114.3; 455/126

(58) Field of Classification Search ............. 455/114.3, 455/121–126, 129; 330/149; 375/296
See application file for complete search history.

(56) References Cited

U.S. PATENT DOCUMENTS

| 5,802,451 | A | 9/1998 | Adachi et al. |
| 7,372,918 | B2* | 5/2008 | Muller et al. ............... 375/296 |
| 2004/0127178 | A1 | 7/2004 | Kuffner |
| 2005/0192055 | A1 | 9/2005 | Nimela et al. |
| 2006/0281423 | A1* | 12/2006 | Caimi et al. ................ 455/129 |

* cited by examiner

*Primary Examiner*—Lee Nguyen
(74) *Attorney, Agent, or Firm*—Fay Sharpe LLP

(57) ABSTRACT

A method of controlling a tuneable filter (13a) of an antenna network (13) for use in a base station (1). The proposed method comprises:
 inputting an output of the antenna network (13) to a pre-distortion feedback path (5),
 inputting an output of the pre-distortion feedback path (5) and part of an original baseband signal to be transmitted by the base station (1) to a tuneable filter optimization algorithm (20a),
 controlling the tuneable filter (13a) in accordance with an output (CS) of said tuneable filter optimization algorithm (20a).

10 Claims, 2 Drawing Sheets

TUNEABLE FILTER CONTROL METHOD AND BASE STATION

The invention is based on a priority application EP 06 291 217.5 which is hereby incorporated by reference.

TECHNICAL FIELD

The present invention relates to a method of controlling a tuneable filter of an antenna network for use in a base station.

The present invention also relates to a radio transmitter having a forward signal processing path including an antenna network with tuneable filter.

The present invention further relates to a base station for use in a radio communication system.

BACKGROUND OF THE INVENTION

Multistandard-Multiband radio base stations, i.e. the radio transmitters comprised in said type of base stations, must have tuneable or switchable radio filters in connection with an output amplifier radio stage in order to prevent impairments of radio conditions in other radio cells and/or on other radio bands. Generally, electrical filter characteristics such as mid frequency, quality factor, etc., of a tuneable filter can be adjusted by means of a number of electric actuators (generally in the form of motors) which are disposed at the antenna network for interaction with suitable filter adjusting elements, e.g. screws, chambers, lengths, etc.

In the prior art, a look-up table is provided which comprises corresponding filter tuning or adjusting values for a given radio frequency or operation point of the above-defined radio transmitter/base station.

Accordingly, for a given operating point, for instance a predefined radio frequency of the tuneable filter, said actuator means drive the tuneable filter to a predefined point of operation in accordance with values comprised in said look-up table.

This approach suffers from the inherent disadvantage that due to aging effects and variable temperature characteristics within the radio transmitter or base station the characteristics of a tuneable filter generally are not tuned in an optimised fashion.

SUMMARY OF THE INVENTION

It is the object of the present invention to provide a method of controlling a tuneable filter of an antenna network for use in a base station, which is capable of achieving an improved adjustment of filter characteristics. It is also an object of the present invention to provide a radio transmitter and a base station capable of translating said method into practise.

According to a first aspect of the present invention the object is achieved by providing a method of controlling a tuneable filter of an antenna network for use in a base station, comprising:
  inputting an output of the antenna network to a pre-distortion feedback path,
  inputting an output of the pre-distortion feedback path and part of an original baseband signal to be transmitted by the base station to a tuneable filter optimisation algorithm,
  controlling the tuneable filter in accordance with an output of said tuneable filter optimisation algorithm.

According to a second aspect of the present invention the object is achieved by providing a radio transmitter having a forward signal processing path including an antenna network with tuneable filter, a pre-distortion feedback path, and a tuneable filter optimisation means, further comprising:
  means for providing an output of the antenna network to the pre-distortion feedback path,
  means for providing an output of the pre-distortion feedback path to said suitable filter optimisation means,
  means for providing part of an original baseband signal to be transmitted to said tuneable filter optimisation means,
  means for providing an output of the tuneable filter optimisation means to the antenna network for controlling the tuneable filter.

According to a third aspect of the present invention the object is also achieved by providing a base station for use in a radio communication system, said base station comprising the radio transmitter according to said second aspect of the present invention.

Thus, in accordance with embodiments of the present invention the pre-distortion feedback path or loop of a conventional radio transmitter or base station is employed to control operating parameters of the tuneable filter. The observation signal at an output of the antenna network is submitted to the pre-distortion feedback loop which generally comprises frequency down-conversion, analog/digital conversion and demodulation, and is then provided to an optimisation algorithm which uses the feedback signal and part of an original baseband signal for transmission by the transmitter or base station in order to generate an optimisation algorithm output signal which can be used for controlling the tuneable filter.

In a further embodiment of the method in accordance with the present invention the tuneable filter optimisation algorithm implements a closed adaptive loop for controlling the tuneable filter. In this way, the inventive approach allows for optimum adjustment of filter characteristics at all times.

In yet another embodiment of the method in accordance with the present invention controls the tuneable filter involves controlling motor positions of motor means for adjusting filter elements of the tuneable filter.

A specific form of the algorithm for implementing said closed adaptive loop is not part of the present invention. However, in an embodiment of the method in accordance with the present invention the tuneable filter optimisation algorithm includes comparing in-phase and quadrature component signals of the original baseband signal with in-phase and quadrature component signals of the antenna network output.

In this context and yet in another embodiment of the method in accordance with the present invention controls the tuneable filter comprises minimising an insertion loss of the tuneable filter.

As will be appreciated by a person skilled in the art, the latter embodiments provide an attractive feature also with respect to signal transmission by means of single-carrier, non-multistandard transmitter/base stations.

In a further embodiment, the inventive solution can be enhanced to implement an error control mechanism by further comprising switching off transmission of the original baseband signal by the base station if the output of said tuneable filter optimisation algorithm indicates a deviation of the tuneable filter from a desired filter characteristic, in particular a filter band. In this way, negative effects on other radio cells and/or frequency bands can be prevented.

Preferred uses of the radio transmitter in accordance with said second aspect of the present invention and the base station in accordance with said third aspect of the present invention include—without limitation—Software-defined Radio (SDR) communication systems.

Further advantages and characteristics of the present invention can be gathered from the following description of preferred embodiments given by way of example only with reference to the enclosed drawings. Features mentioned above as well as below can be used either individually or in conjunction in accordance with the present invention. The described embodiments are not to be regarded as an exhaustive enumeration but rather as examples with respect to a basic concept underlying the present invention.

DETAILED DESCRIPTION OF PREFERRED EMBODIMENTS

Figure 1:
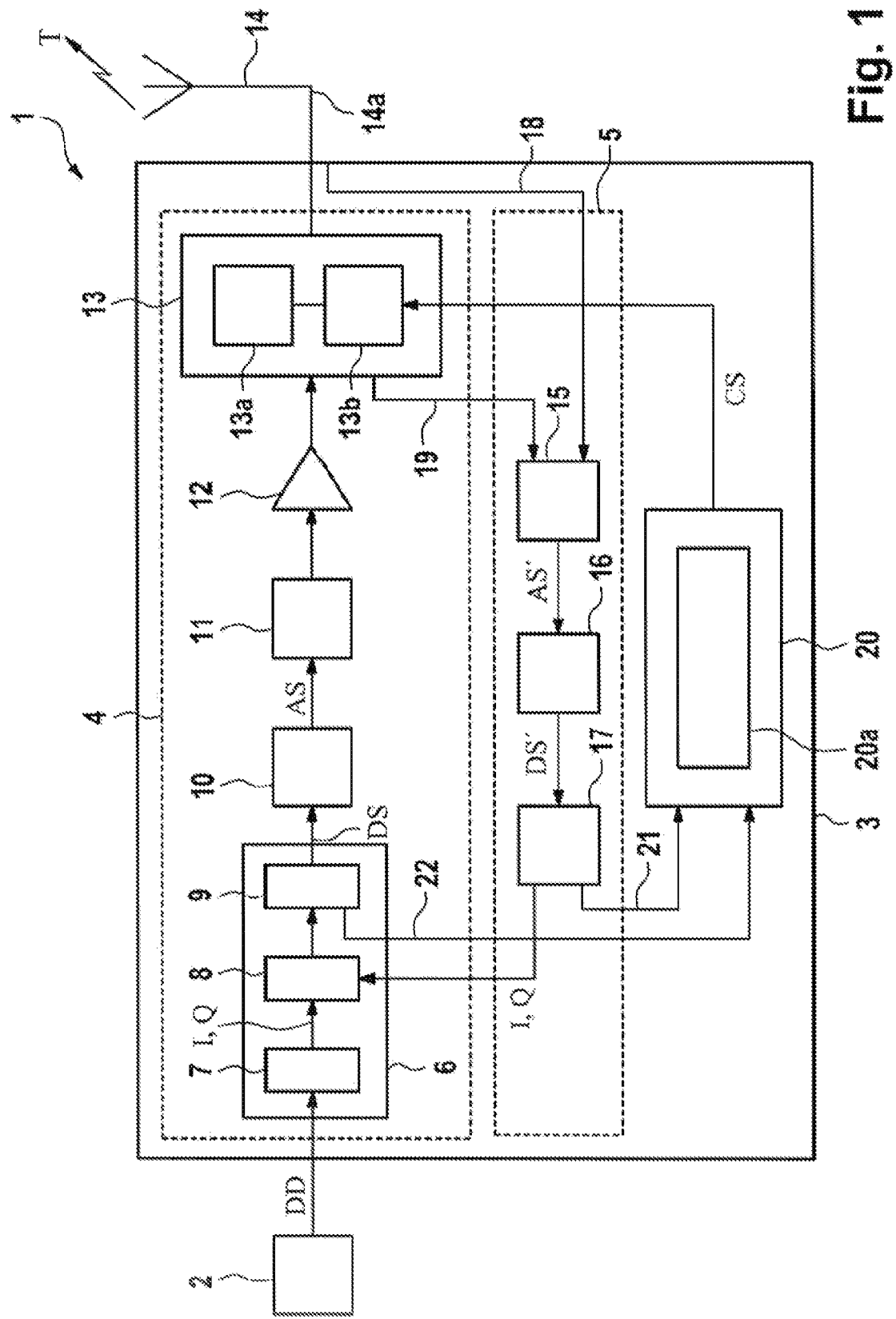
FIG. 1 is a schematic block diagram of a radio transmitter and base station in accordance with the present invention.

FIG. 1 shows a schematic block diagram of a radio transmitter and base station in accordance with the present invention for use in a radio-based communication system, in particular a Software-defined Radio (SDR) communication system. Said SDR communication system can further be devised for Multiband-Multistandard radio transmission.

According to the embodiment of FIG. 1, base station 1 generally comprises a transmitter controller 2 in operative connection with transmitter 3. Transmitter 3 comprises a forward signal processing path 4 and a pre-distortion feedback path 5 illustrated by means of respective dashed boxes in FIG. 1.

In said forward signal processing path 4, transmitter 3 comprises a digital baseband stage 6 having a digital modulator 7, a pre-distorter 8, and a digital quadrature modulator 9. Said digital baseband stage 6 is connected with a digital/analog converter 10 which is further connected with an analog frequency upconverter 11. An output of said analog upconverter 11 is connected with a power amplifier 12. Behind power amplifier 12 there is disposed an antenna network 13 with tuneable or switchable filter means 13a, hereinafter referred to as antenna network with tuneable filter or simply as antenna network. An output of said antenna network 13 is connected via antenna line 14a with an antenna 14 for transmission T of radio signals of a given standard and/or frequency. Tuneable filter means 13a is connected with actuator or motor means 13b.

In pre-distortion feedback path 5, transmitter 3 comprises an analog frequency downconverter 15, an analog/digital converter 16, and a digital quadrature demodulator 17. An input of analog down converter 15 is connected with antenna line 14a between antenna network 13 and antenna 14 via a first coupler 18. Input of downconverter 15 is further connected with the output of power amplifier 12 via a second coupler 19. An output of downconverter 15 is connected with analog/digital converter 16. An output of analog/digital converter 16 is connected with an input of digital quadrature demodulator 17, an output of which is connected with digital baseband stage 6.

Furthermore, in transmitter 3 there is provided a tuneable filter optimisation means 20 implementing a tuneable filter optimisation algorithm 20a. Respective inputs of tuneable filter optimisation means 20 are connected with the output of digital quadrature demodulator 17 via a third coupler 21 and with the output of digital baseband stage 6 via a fourth coupler 22, respectively. An output of tuneable filter optimisation means 20 is connected with antenna network 13, i.e. motor means 13b comprised therein.

Operation of base station 1 and transmitter 3, respectively, according to the embodiment of FIG. 1 will now be described in detail.

Digital data DD that is to be sent by transmitter 3 is provided to digital bandbase stage 6, i.e. modulator 7 comprised therein, from transmitter controller 2 that is operative to receive data over a link channel from any suitable source (not shown) and is adapted to formulate the data for subsequent transmission. In principle, transmitter 3 can use any suitable modulation scheme for transmitting the data. In the shown embodiment, it is assumed that transmitter 3 uses Quadrature Amplitude Modulation (QAM). Thus, modulator 7 is operative to correlate each data symbol with predetermined in-phase and quadrature output signals, generally referred to as I and Q signals. In this way, for each unique data symbol a different combination of in-phase I and quadrature Q component signals for the baseband signal is output by modulator 7.

The in-phase I and quadrature Q component signals output by modulator 7 are input into pre-distorter 8. Pre-distorter 8 is operative to modify the I and Q component signals in order to compensate for distortion effects subsequently introduced by power amplifier 12. The compensation provided by pre-distorter 8 is controlled by means of pre-distortion feedback path 5, as known to a person skilled in the art. In other words: an output of power amplifier 12 is fed back to the digital baseband stage 6, i.e. pre-distorter 8, by means of said second coupler 19 and the above-described further elements 15-17 of pre-distortion feedback path 5.

The output of pre-distorter 8 is provided to the digital quadrature modulator 9. The latter converts the in-phase I and quadrature Q component signals into a single real digital signal DS. Said signal is received by digital/analog converter 10 that converts said signal to an intermediate frequency analog signal AS.

The intermediate frequency signal output from digital/analog converter 10 is provided to analog upconverter 11 which converts the intermediate frequency signal to a transmission frequency signal having a frequency within a predefined frequency band, the latter being subject to suitable software control in the context of an SDR communication system, in particular a Multistandard-Multiband SDR communication system, as known to a person skilled in the art.

Alternatively, the analog upconverter 11 can be a suitable conventional upconverter, e.g. a mixer receiving a local oscillator signal.

The transmission frequency signal from upconverter 11 is provided to power amplifier 12, which amplifies the signal and provides the amplified signal to antenna network 13. Said antenna network 13 with tuneable filter 13a is provided in order to prevent distortions in other radio cells (not shown) and/or on other radio bands in the context of Multistandard-Multiband radio transmission.

As known to a person skilled in the art, the filter characteristics have to be adjusted in accordance with the current standard and/or frequency band used by transmitter 3. Said filter characteristics to be adjusted may include mid frequency, quality factor, or the like and are usually adjusted by using said motor means 13b comprised in antenna network 13. As known to a person skilled in the art, said motor means 13b may comprise a stepper motor, a piezo motor, or the like, which are used for adjusting corresponding elements such as screws, chambers, lengths, or the like (not shown) in connection with tuneable filter means such as surface acoustic wave (SAW) filters, LC-filters, waveguide filters, or the like. In order to achieve accurate pre-distortion of the signal, feedback loop 5 monitors the amplified signal from power amplifier 12. To this end, part of the signal output from power amplifier 12 is provided to the analog downconverter 15 via the second coupler 19.

Downconverter 15 operates in an opposite manner with respect to analog upconverter 11. In particular, the downconverter 15 lowers frequency of the feedback signal provided by power amplifier 12 to an intermediate frequency analog signal AS', which is adjusted in the frequency domain to the working point or current operating frequency of the tuneable filter 13a in antenna network 13.

Then, the intermediate frequency signal AS' is converted into a digital signal DS' by means of analog/digital converter 16. Digital quadrature demodulator 17 performs a digital quadrature demodulation of said digital signal DS' and outputs an in-phase I component signal and a quadrature Q component signal. Said I and Q component signals are then provided to digital baseband stage 6 for controlling operation of pre-distorter 8 by any suitable means (not shown) as known to a person skilled in the art.

Additionally, the transmission signal output from antenna network 13 is also provided initially to feedback path 5 by means of said first coupler 18. After corresponding down-conversion, analog/digital conversion and digital quadrature demodulation, respective I and Q component signals are provided to tuneable filter optimisation means 20 via said third coupler 21. Furthermore, said tuneable filter optimisation means 20 also receives the original (to be transmitted) I and Q component signals output from pre-distorter 8 in digital baseband stage 6 through said fourth coupler 22. In this way, by implementing a suitable tuneable filter optimisation algorithm 20a on said tuneable filter optimisation means 20, from the downconverted baseband I and Q component signals (samples) of the radio signal output from the antenna network 13 and from the transmitted original I and Q component signals output from pre-distorter 8 the best actuator positions or adjustments for motor means 13b (with respect to a filter frequency attenuation window) can be derived in a closed adaptive loop.

Note that said tuneable filter optimisation algorithm 20a as such does not form part of the present invention. However, a feasible algorithm may comprise comparing the I and Q component signals from pre-distorter 8 with the observed I and Q component signals output from antenna network 13, i.e. feedback path 5, and optimising a control signal CS output from tuneable filter optimisation means 20 for controlling antenna network 13, i.e. said motor means for filter tuning, in view of minimum insertion loss.

As will be appreciated by a person skilled in the art the present approach is not limited to Multistandard-Multiband base stations and may also be used for optimising filter characteristics in conventional signal carrier non-multistandard base stations.

Figure 2:
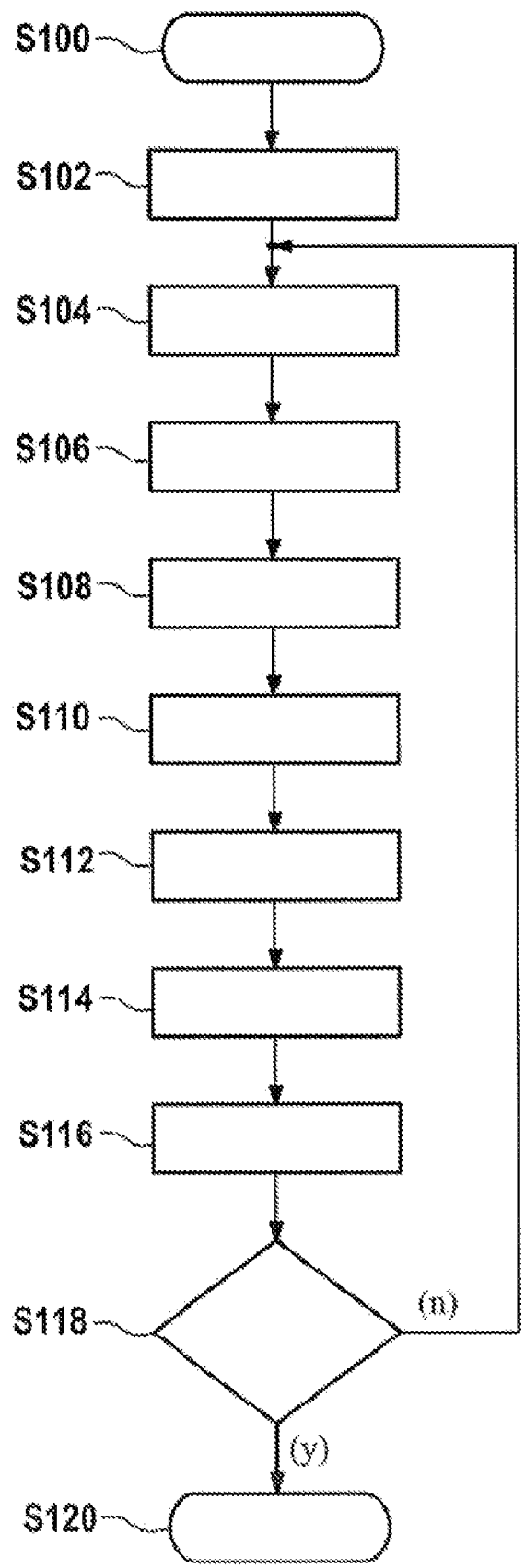
FIG. 2 is a flow chart of an embodiment of the method in accordance with the present invention.

FIG. 2 shows a flow chart of an embodiment of the method in accordance with the present invention.

The method starts with step S100. In subsequent step S102 digital data to be sent are transmitted along forward signal processing path 4 thus generating an analog transmission signal for transmission by antenna 14 of FIG. 1, as previously described.

In subsequent step S104 said transmission signal is observed at the output of antenna network 13 of FIG. 1, and the observed signal is sent back via pre-distortion feedback path 5 (FIG. 1) in step S106.

After frequency down-conversion, analog/digital conversion, and suitable demodulation, as previously described, in subsequent step S108 the observed signal is provided to tuneable filter optimisation means 20 of FIG. 1. Furthermore in step S10, part of the original baseband signal is also provided to tuneable filter optimisation means 20.

Then, in step S112 a suitable tuneable filter optimisation algorithm is performed on tuneable filter optimisation means 20, which may include comparing said input signals to tuneable filter optimisation means 20 (cf. steps S108 and S110) in order to generate a control signal for controlling tuneable filter means in antenna network 13 of FIG. 1, step S114.

Then, in subsequent step S116 said control signal is used for adjusting filter characteristics of said tuneable filter means.

In subsequent step S118 there is decided whether or not said filter adjustments have been sufficient for achieving a predefined filtering characteristic, e.g. in view of minimum insertion loss or the like. If said question is answered in the affirmative (y), then the method terminates with step S120.

If the question in step S118 is answered in the negative (n), then the inventive method returns to step S104, thus resulting in an adaptive closed loop mechanism for controlling tuneable filter in antenna network 13, as previously described.

In this way aging as well as varying temperature characteristics within a base station can be compensated, thus achieving optimum tuneable filter characteristics.

The invention claimed is:

1. A method of controlling a tuneable filter of an antenna network for use in a base station, comprising:
   inputting an output of the antenna network to a pre-distortion feedback path,
   inputting an output of the pre-distortion feedback path and part of an original baseband signal to be transmitted by the base station to a tuneable filter optimisation algorithm,
   controlling the tuneable filter in accordance with an output (CS) of said tuneable filter optimisation algorithm.

2. The method of claim 1, wherein the tuneable filter optimisation algorithm implements a closed adaptive loop for controlling the tuneable filter.

3. The method of claim 1, wherein controlling the tuneable filter involves controlling motor positions of motor means for adjusting filter elements of the tuneable filter.

4. The method of claim 1, wherein controlling the tuneable filter comprises minimising an insertion loss of the tuneable filter.

5. The method of claim 1, wherein the tuneable filter optimisation algorithm includes comparing in-phase and quadrature component signals of the original baseband signal with in-phase and quadrature component signals of the antenna network output.

6. The method of claim 1, further comprising switching off transmission of the original baseband signal by the base station if the output of said tuneable filter optimisation algorithm indicates a deviation of the tuneable filter from a desired filter characteristic, in particular a filter band.

7. A radio transmitter having a forward signal processing path including an antenna network with tuneable filter, a pre-distortion feedback path, and a tuneable filter optimisation means, further comprising:
   means for providing an output of the antenna network to the pre-distortion feedback path,
   means for providing an output of the pre-distortion feedback path to said suitable filter optimisation means,
   means for providing part of an original baseband signal to be transmitted to said tuneable filter optimisation means,
   means for providing an output of the tuneable filter optimisation means to the antenna network for controlling the tuneable filter.

8. A base station for use in a radio communication system, comprising the radio transmitter of claim 7.

9. Use of the base station of claim 8 in a Software-defined Radio communication system.

10. Use of the radio transmitter of claim 7 in a Software-defined Radio communication system.

* * * * *